(12) United States Patent
Adkisson et al.

(10) Patent No.: US 8,723,392 B2
(45) Date of Patent: May 13, 2014

(54) SAW FILTER HAVING PLANAR BARRIER LAYER AND METHOD OF MAKING

(75) Inventors: James W. Adkisson, Jerico, VT (US); Panglijen Candra, Essex Junction, VT (US); Thomas J. Dunbar, Stamford, CT (US); Jeffrey P. Gambino, Westford, VT (US); Mark D. Jaffe, Shelburne, VT (US); Anthony K. Stamper, Williston, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/183,977

(22) Filed: Jul. 15, 2011

(65) Prior Publication Data

US 2013/0015744 A1 Jan. 17, 2013

(51) Int. Cl.
 *H03H 9/25* (2006.01)
(52) U.S. Cl.
 USPC .................. 310/313 R; 333/193; 333/194
(58) Field of Classification Search
 USPC ............... 310/313 R; 333/193–196
 See application file for complete search history.

(56) References Cited

U.S. PATENT DOCUMENTS

| | | | |
|---|---|---|---|
| 4,237,433 A * | 12/1980 | Tanski | 333/195 |
| 4,879,487 A * | 11/1989 | Sugai et al. | 310/313 A |
| 5,343,107 A | 8/1994 | Shikata et al. | |
| 5,654,127 A * | 8/1997 | Leedy | 430/315 |
| 6,004,188 A | 12/1999 | Roy | |
| 6,205,658 B1 | 3/2001 | Kawano | |
| 6,376,353 B1 | 4/2002 | Zhou et al. | |
| 6,555,946 B1 | 4/2003 | Finder et al. | |
| 6,806,796 B2 * | 10/2004 | Kadota et al. | 333/193 |
| 6,853,115 B2 | 2/2005 | Menzel et al. | |
| 7,213,314 B2 | 5/2007 | Abbott et al. | |
| 7,259,032 B2 | 8/2007 | Murata et al. | |
| 7,385,334 B1 * | 6/2008 | Olsson et al. | 310/322 |
| 7,446,453 B1 | 11/2008 | Naumenko et al. | |
| 7,629,866 B2 | 12/2009 | Kadota et al. | |
| 7,723,227 B1 | 5/2010 | Bian | |
| 7,915,786 B2 | 3/2011 | Matsuda et al. | |
| 8,344,589 B2 * | 1/2013 | Yaoi et al. | 310/313 B |
| 2002/0079987 A1 | 6/2002 | Yip et al. | |
| 2004/0076081 A1 * | 4/2004 | Menzel et al. | 367/140 |
| 2004/0251792 A1 | 12/2004 | Matsuda et al. | |
| 2006/0134834 A1 | 6/2006 | Nakano et al. | |
| 2007/0120216 A1 | 5/2007 | Brigante et al. | |
| 2007/0224706 A1 | 9/2007 | Izumi | |
| 2009/0021109 A1 | 1/2009 | Furukawa et al. | |
| 2010/0019386 A1 | 1/2010 | Oh et al. | |
| 2010/0244624 A1 | 9/2010 | Matsuda et al. | |
| 2010/0320866 A1 * | 12/2010 | Kadota et al. | 310/313 A |
| 2011/0012695 A1 | 1/2011 | Yamaji et al. | |

OTHER PUBLICATIONS

Kimura et al., "High Q SAW Resonator Using Upper-Electrodes on Grooved-Electrodes in LiTaO3," 2010, pp. 1740-1743, IEEE.

(Continued)

*Primary Examiner* — Thomas Dougherty
(74) *Attorney, Agent, or Firm* — Richard M. Kotulak; Hoffman Warnick LLC

(57) ABSTRACT

Disclosed herein is a surface acoustic wave (SAW) filter and method of making the same. The SAW filter includes a piezoelectric substrate; a planar barrier layer disposed above the piezoelectric substrate, and at least one conductor buried in the piezoelectric substrate and the planar barrier layer.

13 Claims, 7 Drawing Sheets

(56) References Cited

OTHER PUBLICATIONS

Nakai et al., "Surface Acoustic Wave Duplexer Composed of SiO2 Film with Convex and Concave on Cu-electrodes/LiNbO3 Structure," 2008, pp. 1580-1583, Digital Object Identifier: 10.1109/ULTSYM.2008.0385, IEEE International Ultrasonics Symposium Proceedings.

Reitz et al., "Damascene Technique Applied to Surface Acoustic Wave Devices," 2007, pp. 271-276, J. Vac. Science Technology, B 25(1), American Vacuum Society.

Patent Cooperation Treaty, Notification of Transmittal of the International Search Report and the Written Opinion of the International Searching Authority, or the Declaration for PCT/US2012/044908 dated Oct. 2, 2012, 11 pages.

* cited by examiner

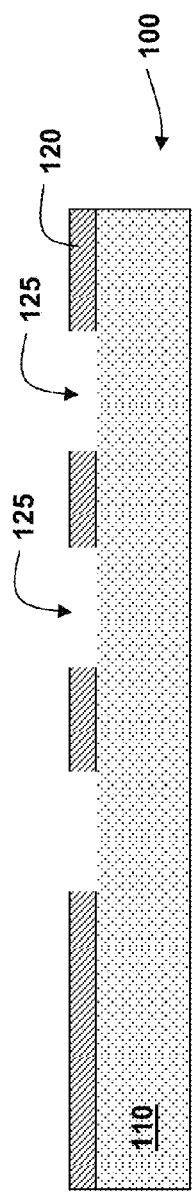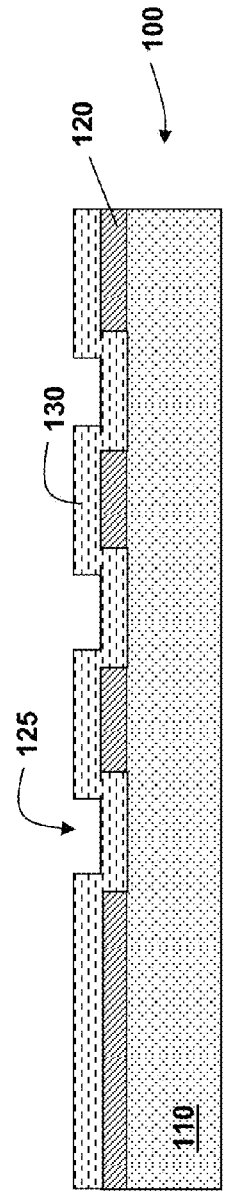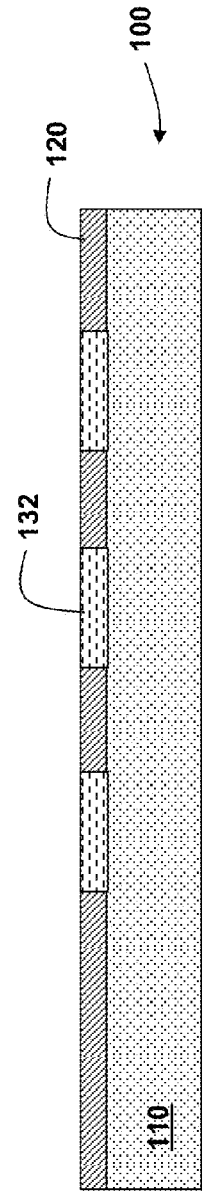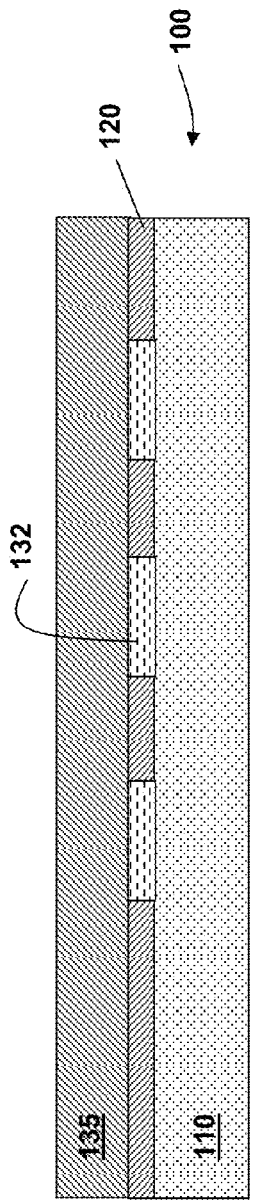

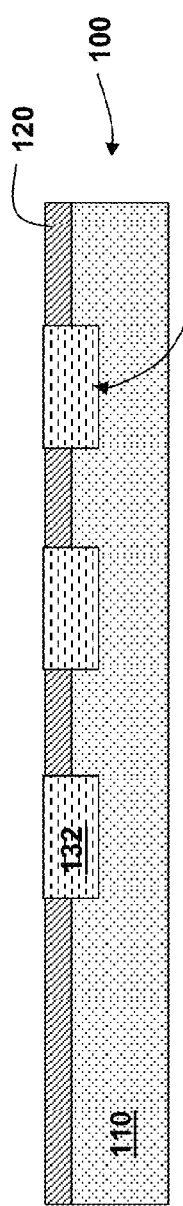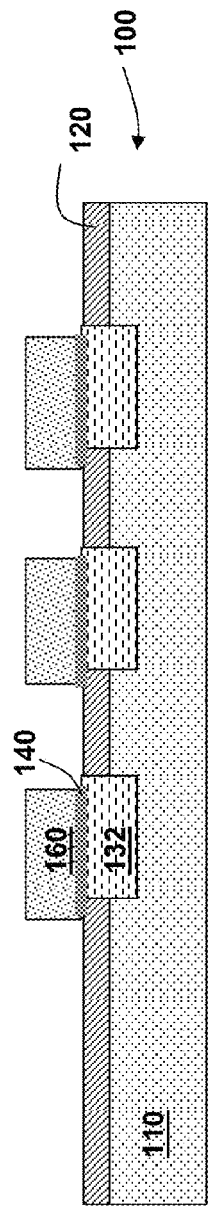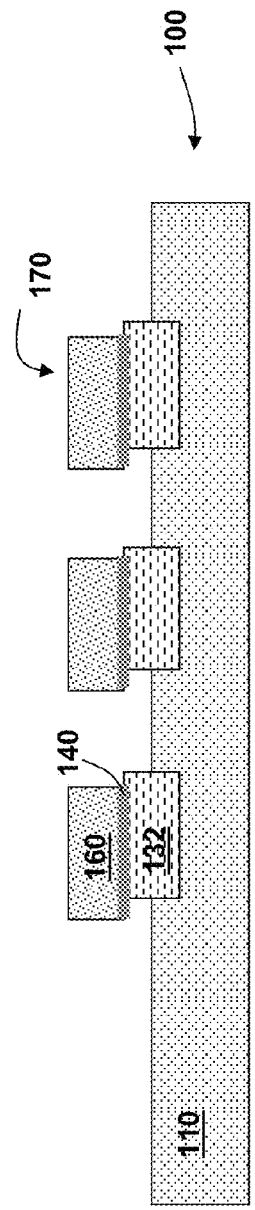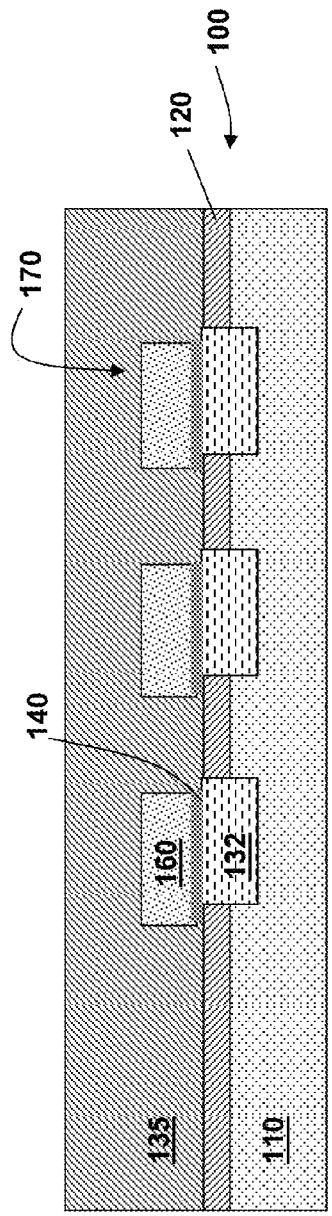

SAW FILTER HAVING PLANAR BARRIER LAYER AND METHOD OF MAKING

FIELD OF THE INVENTION

This disclosure relates generally to surface acoustic wave (SAW) filters, and more particularly to SAW filter devices and a method of making the same, including a planar barrier layer.

BACKGROUND

Surface acoustic wave (SAW) filters are frequently used for radio frequency (RF) filtering in devices such as wireless communication systems, due to small chip size and low insertion loss. The performance of a SAW filter depends on the characteristics of the SAW propagated in a piezoelectric substrate. SAW filters having low temperature coefficients of frequency (TCF) result in greater temperature independence at frequencies near the center of the pass band of the device.

Buried metal SAW filters have been used, and have demonstrated high electromagnetic coupling (high bandwidth), but may not provide a satisfactory TCF. Other challenges of buried metal SAW filters include damage to the piezoelectric substrate during polishing or etching steps of fabrication, and difficulty controlling thickness of buried electrodes, which in turn affects the signal frequency transmitted by the SAW filter.

BRIEF SUMMARY

A first aspect of the disclosure provides a surface acoustic wave (SAW) filter comprising: a piezoelectric substrate; a planar barrier layer disposed above the piezoelectric substrate; and at least one metal conductor disposed in at least one trench in the planar barrier layer.

A second aspect of the disclosure provides a method for making a surface acoustic wave (SAW) filter, the method comprising: depositing a planar barrier layer on a piezoelectric substrate; patterning the planar barrier layer to form at least one trench; depositing a metal layer above the planar barrier layer; and polishing the metal layer to form at least one metal conductor.

A third aspect of the disclosure provides a surface acoustic wave (SAW) filter comprising: a piezoelectric substrate; an $SiO_2$ planar barrier layer disposed above the piezoelectric substrate; at least one Cu conductor buried in the planar barrier layer and the piezoelectric substrate; a diffusion barrier layer disposed above each of the at least one Cu conductors; at least one Al conductor disposed above the diffusion barrier layer; and a second $SiO_2$ layer disposed above the $SiO_2$ the planar barrier layer and the at least one Al conductor.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

FIGS. 1-4 show an embodiment of a SAW filter structure and process for making the same.

FIGS. 13-16 show an embodiment of a SAW filter structure having stacked electrodes, and process for making the same.

Figure 5:
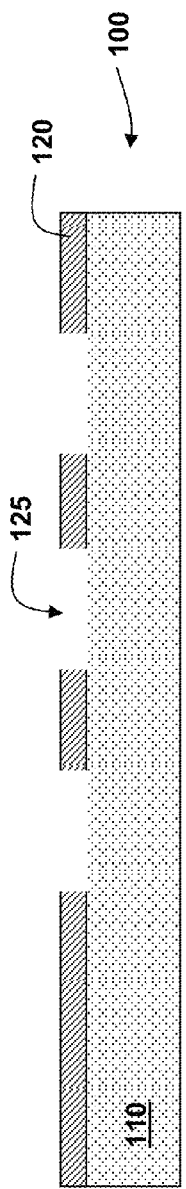
FIGS. 5-8 show an embodiment of a SAW filter structure having a diffusion barrier, and process for making the same.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As noted above, FIGS. 1-25 show various embodiments of a SAW filter 100, and processes for making the same.

Referring to the drawings, FIGS. 1-4 depict one embodiment of SAW filter 100 and a process for making the same. As shown in FIG. 1, a piezoelectric substrate 110 is provided, which may comprise lithium niobate ($LiNbO_3$), among other piezoelectric substrates. A planar barrier layer 120 is provided above piezoelectric substrate 110. In various embodiments, planar barrier layer 120 may be $SiO_2$, and may have a thickness of about 100 nm. Planar barrier layer 120 may be patterned using, e.g., lithography and etching, to form at least one trench 125 in planar barrier layer 120.

As shown in FIG. 2, metal layer 130 is deposited above planar barrier layer 120 and piezoelectric substrate 110. In an embodiment, metal layer 130 may be copper (Cu), and may be deposited by, e.g., physical vapor deposition (PVD). In FIG. 3, metal layer 130 may be polished using, e.g., chemical mechanical polishing (CMP) to form at least one metal conductor 132. During polishing, barrier layer 120 acts as a polish stop, protecting piezoelectric substrate 110. In FIG. 4, a layer of $SiO_2$ 135 may be deposited over planar barrier layer 120 and metal conductor 130.

Figure 6:
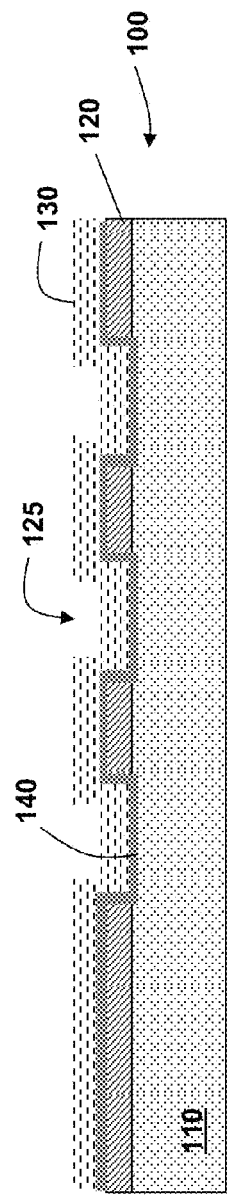
Figure 7:
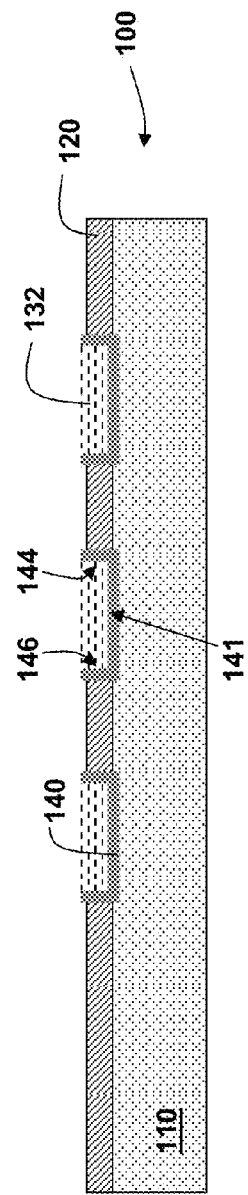
Figure 8:
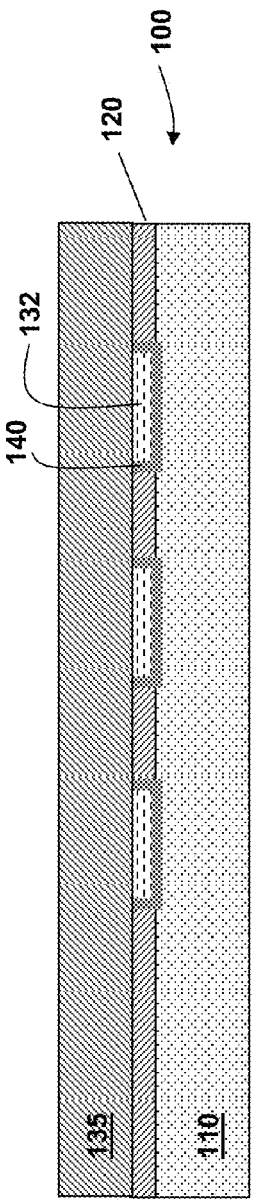

FIGS. 5-8 depict a further embodiment of SAW filter 100. As shown in FIG. 5, planar barrier layer 120 is deposited above piezoelectric substrate 110 and patterned to form trenches 125, as discussed relative to FIG. 1. As shown in FIG. 6, a liner or diffusion barrier layer 140 is deposited above planar barrier layer 120 and piezoelectric substrate 110 by, e.g., PVD. The composition of diffusion barrier layer 140 may be any of TaN/Ta, TaSiN/Ta, WN/Ta, WN/Ru, or another composition. As shown in FIG. 6, metal layer 130 may be deposited over diffusion barrier layer 140. In FIG. 7, diffusion barrier layer 140 and metal layer 130 may be polished via, e.g., CMP to form at least one metal conductor 132 lined by diffusion barrier layer 140. Diffusion barrier layer 140 lines both a horizontal surface 141 beneath metal conductor 132 as well as vertical surfaces 144, 146 of metal conductor 132 as shown in FIG. 7. In FIG. 8, a layer 135 of $SiO_2$ may be deposited over planar barrier layer 120, metal conductor 132, and diffusion barrier layer 140.

Figure 9:
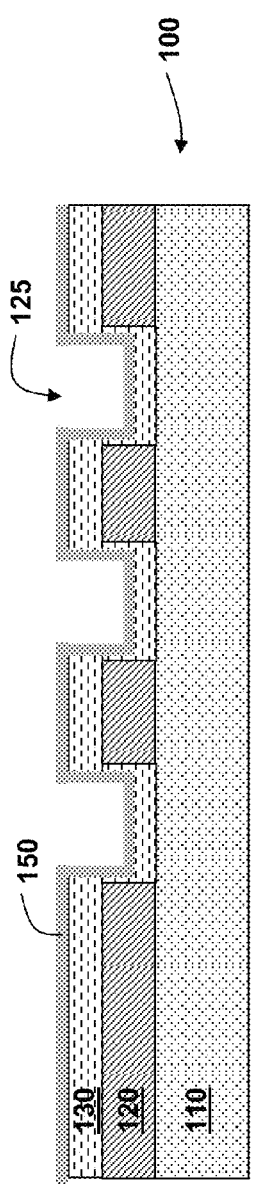
FIGS. 9-12 show an embodiment of a SAW filter structure including a cap layer, and process for making the same.
Figure 10:
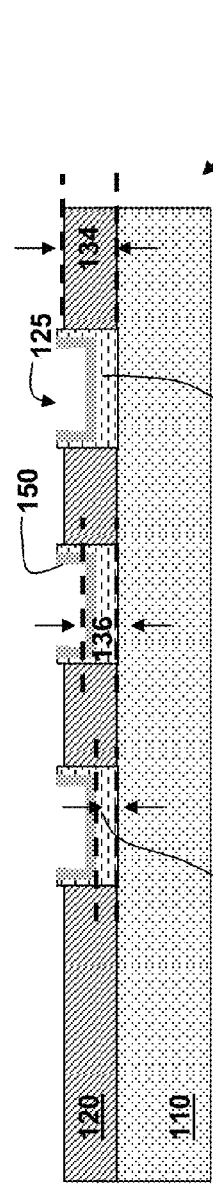

FIGS. 9-12 show a further embodiment of SAW filter 100. As shown in FIG. 9, planar barrier layer 120 is deposited over piezoelectric substrate 110 and patterned to form trenches 125 as discussed above. Planar barrier layer 120 may be $SiO_2$, and may have a thickness of about 200 nm. Metal layer 130 is deposited over planar barrier layer 120 and piezoelectric substrate 110 by, e.g., PVD. Cap layer 150, which may be, e.g., SiN, may then be deposited over metal layer 130 by PVD or plasma-enhanced chemical vapor deposition (PECVD). As shown in FIG. 10, metal layer 130 and cap layer 150 may be polished using, e.g., CMP, using planar barrier layer 120 as a polish stop.

In an embodiment, metal layer 130 may be deposited such that a thickness 133 of metal layer 130 is less than a depth 134 of trench 125, i.e., that metal layer 130 does not fill the full depth 134 of trench 125. In a further embodiment, metal layer 130 and cap layer 150 may be deposited such that a collective thickness 136 of metal layer 130 and cap layer 150 may also be less than depth 134 of trench 125, i.e., that together metal layer 130 and cap layer 150 do not fill trench 125 to depth 134 as shown in FIG. 10. In such embodiments, the thickness 133 of metal layer 130, and therefore metal conductor 132, which is recessed in FIGS. 10-12, may be controlled by adjusting the deposition of metal layer 130 rather than by polishing as in the embodiments of FIGS. 3 and 7.

Figure 11:
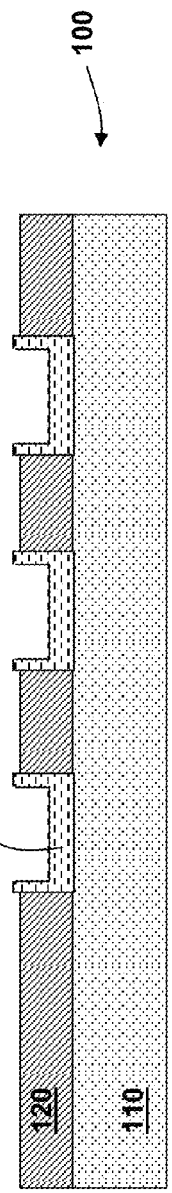
Figure 12:
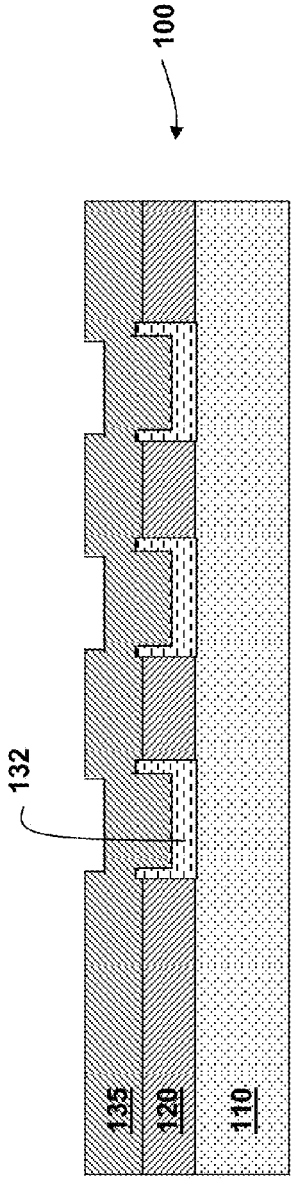

In the embodiment depicted in FIG. 11, cap layer 150 may be removed by etching, although in other embodiments it may not be removed. As shown in FIG. 12, layer 135 of $SiO_2$ may be deposited over planar barrier layer 120, metal conductor 132, and, if present, cap layer 150 (not shown in FIG. 12).

FIGS. 13-16 show a further embodiment of SAW filter 100. As shown in FIG. 13, planar barrier layer 120 is deposited over piezoelectric substrate 110 and patterned to form trenches 125. In some embodiments, planar barrier layer 120 may be $SiO_2$. Metal conductors 132 are formed by depositing metal, which may be copper, over filter structure 100, and polishing the metal using planar barrier layer 120 as a polish stop. Metal conductors 132 are thus buried in piezoelectric substrate 110 and planar barrier layer 120 as shown in FIG. 13.

As shown in FIG. 14, a diffusion barrier layer 140 is deposited over metal conductors 132. Diffusion barrier layer 140 may be, e.g., tantalum nitride (TaN). A second metal layer 160, which may be aluminum (Al), is then deposited above diffusion barrier layer 140. Second metal layer 160 is then etched using, e.g., reactive ion etching using planar barrier layer 120 as an etch stop to protect piezoelectric substrate 110. Second metal layer 160 may be self-aligned such that it is substantially horizontally aligned with diffusion barrier layer 140, as shown in FIGS. 14-16. In FIG. 15, planar barrier layer 120 may then be removed by etching, although in other embodiments it may remain in place. Collectively, metal conductor 132, diffusion barrier layer 140, and second metal layer 160 form stacked metal electrode 170, which may provide high bandwidth/electromagnetic coupling, and a temperature coefficient of frequency of about 0.1. In FIG. 16, layer 135 of $SiO_2$ may be deposited over piezoelectric substrate 110, planar barrier layer 120 if present, and stacked metal electrode 170.

Figure 17:
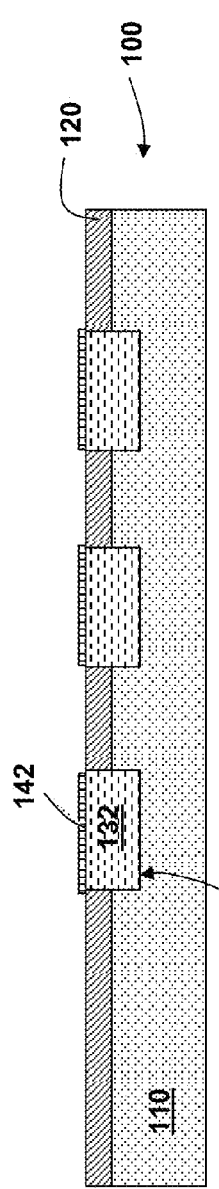
FIGS. 17-20 show an embodiment of a SAW filter structure having stacked electrodes and a diffusion barrier, and process for making the same.

FIGS. 17-20 show a further embodiment. As shown in FIG. 17, planar barrier layer 120 is deposited over piezoelectric substrate 110 and patterned to form trenches 125. In some embodiments, planar barrier layer 120 may be $SiO_2$. Metal conductors 132 are formed by depositing metal, which may be copper, over filter structure 100, and polishing the metal using planar barrier layer 120 as a polish stop to protect piezoelectric substrate 110. Metal conductors 132 are thus buried in piezoelectric substrate 110 and planar barrier layer 120 as shown in FIG. 17. Diffusion barrier layer 142 is deposited over metal conductors 132 in a self aligned process such that metal conductor 132 and diffusion barrier layer 142 are substantially horizontally aligned. Diffusion barrier 142 may be, e.g., cobalt tungsten phosphate (CoWP).

Figure 18:
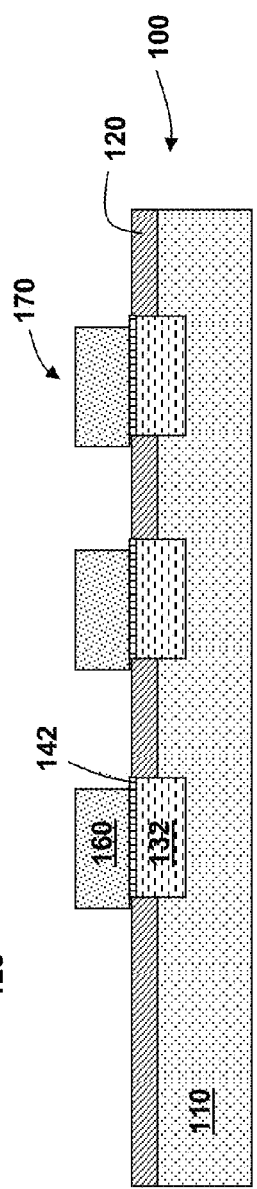
Figure 19:
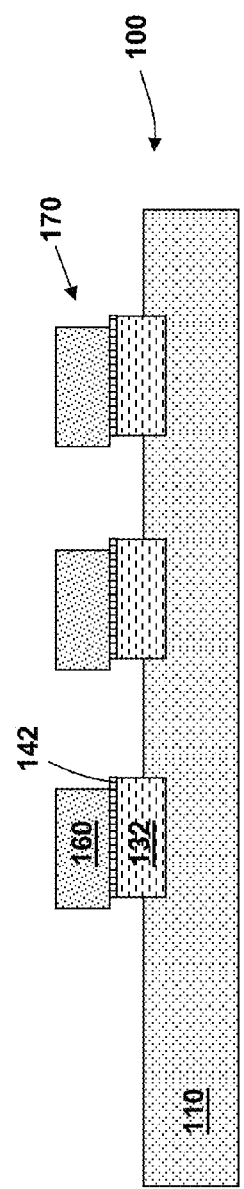
Figure 20:
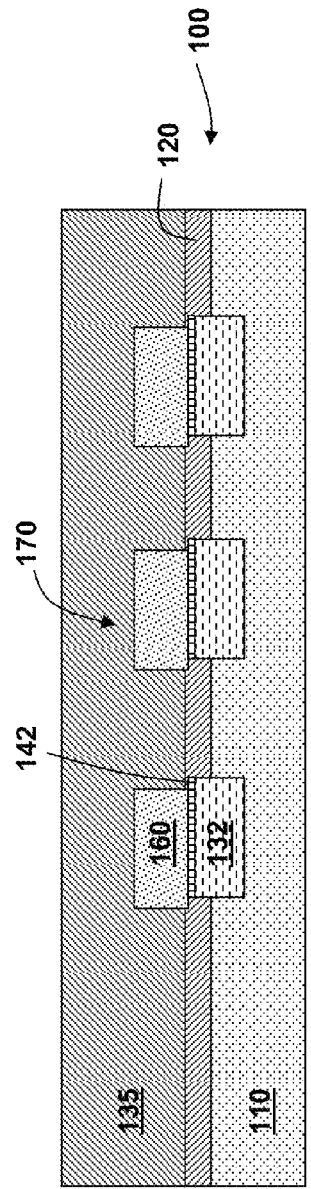

As shown in FIG. 18, second metal layer 160, which may be aluminum (Al), is then deposited above diffusion barrier layer 142. Second metal layer 160 is then etched using, e.g., reactive ion etching using planar barrier layer 120 as an etch stop. In FIG. 19, planar barrier layer 120 may then be removed by etching, although in other embodiments it may remain in place. Collectively, metal conductor 132, diffusion barrier 142, and second metal layer 160 form stacked metal electrode 170, which may provide high bandwidth/electromagnetic coupling, and a temperature coefficient of frequency of about 0.1. In the embodiment depicted in FIG. 20, a layer 135 of $SiO_2$ may be deposited over piezoelectric substrate 110, planar barrier layer 120 if present, and stacked metal electrode 170.

Figure 21:
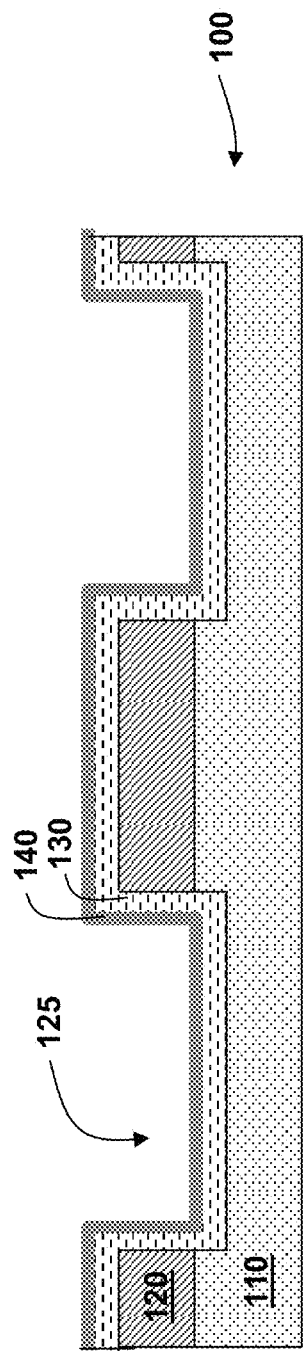
FIGS. 21-25 show an embodiment of a SAW filter structure having self aligned stacked electrodes, and process for making the same.
Figure 22:
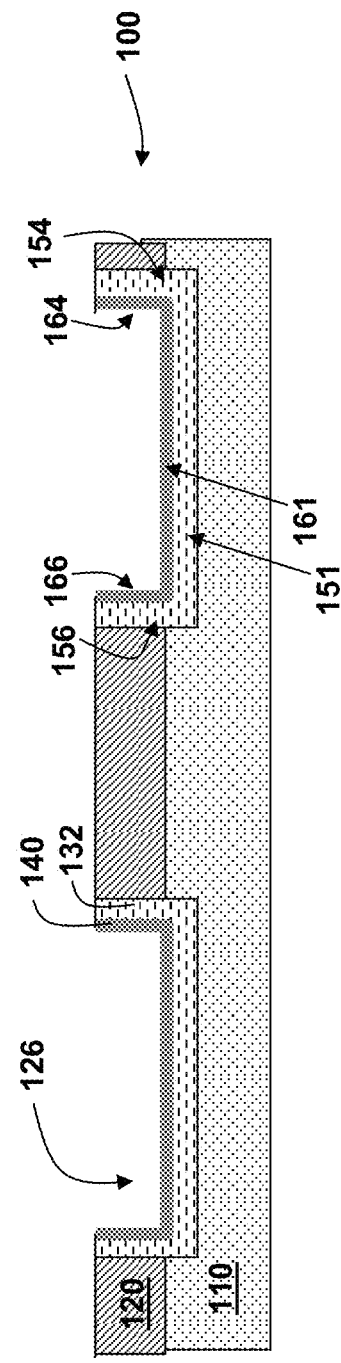

FIGS. 21-24 show a further embodiment including damascene stacked metal electrodes. As shown in FIG. 21, planar barrier layer 120, which may be $SiO_2$, is deposited over piezoelectric substrate 110, and trenches 125 are patterned as discussed above. Metal layer 130 is then deposited over planar barrier layer 120 and trenches 125 by e.g., PVD, followed by deposition of diffusion barrier layer 140, which may be, e.g., TaN. SAW filter 100 is then polished as shown in FIG. 22, resulting in metal conductors 132 which include metal lining both of the horizontal 151 and vertical 164, 166 surfaces of trench 125, and diffusion barrier lining both of the horizontal and vertical surfaces of metal conductor 132. In some embodiments, a recessed etch of metal layer 130 may be performed to form recessed conductors 132.

Figure 23:
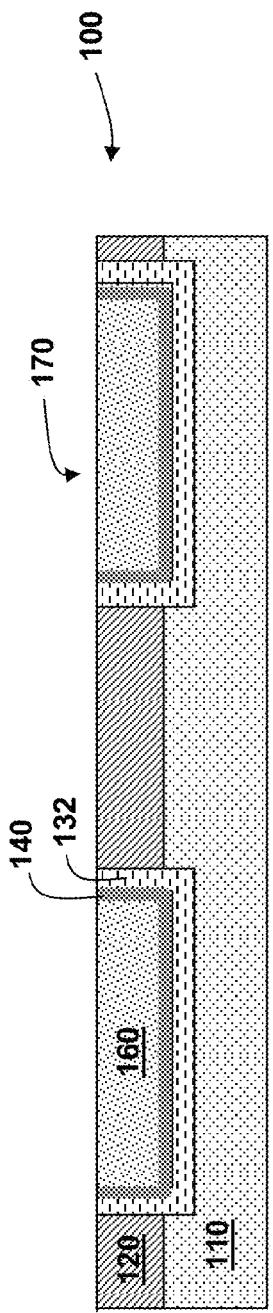
Figure 24:
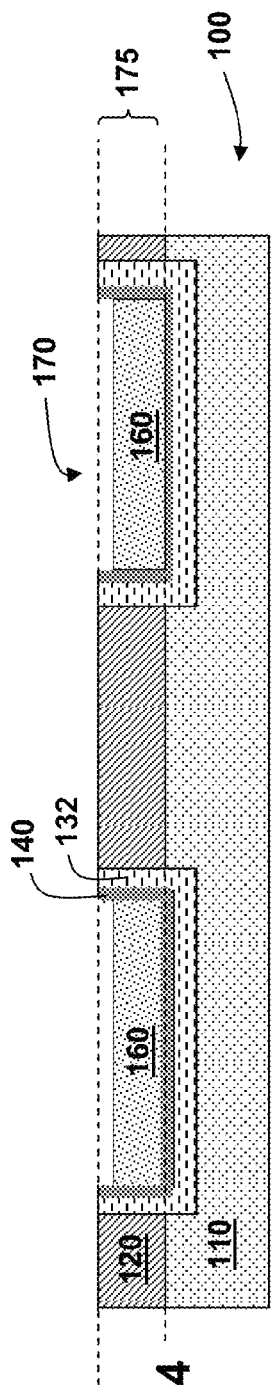
Figure 25:
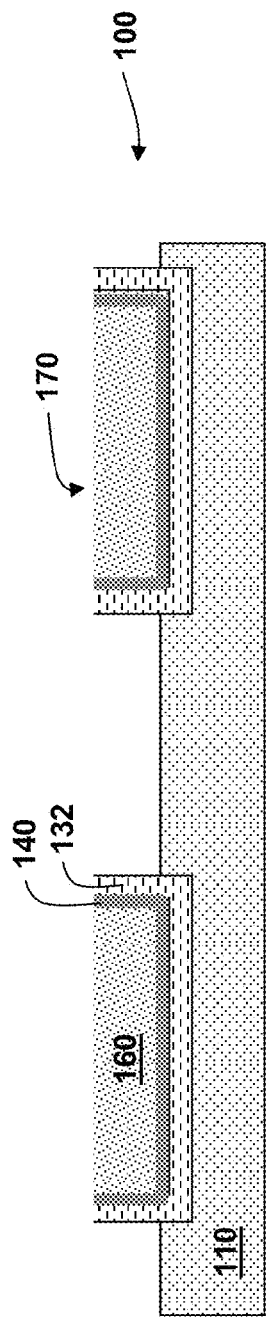

As shown in FIG. 23, second metal layer 160, which may be aluminum (Al), may then be deposited and polished, forming self-aligned stacked metal electrodes 170 having a damascene configuration. In an embodiment, second metal layer 160 may be deposited to a thickness equal to or greater than a depth 175 of lined trench 126. In such an embodiment, the configuration of FIG. 23 may be achieved by polishing second metal layer 160 to the desired depth. In another embodiment, shown in FIG. 24, second metal layer 160 may be deposited such that a collective thickness of metal conductor 132, diffusion barrier layer 140, and second metal layer 160 is less than or equal to a depth of trench 125, as shown in FIG. 24. Thus, the thickness of second metal layer 160, and therefore stacked metal 170 may be controlled by adjusting the deposition of second metal layer 160 rather than by polishing, and may further be recessed in some embodiments as shown in FIG. 24. In some embodiments, as shown in FIG. 25, planar barrier layer 120 may be removed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A surface acoustic wave (SAW) filter comprising:
a piezoelectric substrate;
a planar barrier layer disposed above the piezoelectric substrate; and
at least one metal conductor disposed in at least one trench in the planar barrier layer, wherein each of the at least one metal conductors further comprises a stacked conductor including:
a diffusion barrier layer disposed above each of the at least one metal conductors; and
a metal layer disposed above the diffusion barrier layer,
wherein the metal layer is substantially horizontally aligned with the diffusion barrier layer, and
wherein the at least one metal conductor is buried in the piezoelectric substrate and the planar barrier layer.

2. The SAW filter of claim 1, wherein the planar barrier layer comprises $SiO_2$.

3. The SAW filter of claim 1, wherein the piezoelectric substrate comprises $LiNbO_3$.

4. The SAW filter of claim 1, further comprising an $SiO_2$ layer disposed above the at least one metal conductor and the planar barrier layer.

5. The SAW filter of claim 1, wherein the diffusion barrier layer comprises one of TaN/Ta, TaSiN/Ta, WN/Ta, and WN/Ru.

6. The SAW filter of claim 1,
wherein the metal conductor is substantially horizontally aligned with the diffusion barrier layer.

7. A surface acoustic wave (SAW) filter comprising:
a piezoelectric substrate;
a first $SiO_2$ planar barrier layer disposed above the piezoelectric substrate;
at least one Cu conductor buried in the planar barrier layer and the piezoelectric substrate;
a diffusion barrier layer disposed above each of the at least one Cu conductors;
at least one Al conductor disposed above the diffusion barrier layer; and
a second $SiO_2$ layer disposed above the first $SiO_2$ planar barrier layer and the at least one Al conductor.

8. The SAW filter of claim 1, wherein the at least one metal conductor comprises Cu, and the metal layer comprises an Al layer.

9. A surface acoustic wave (SAW) filter comprising:
a piezoelectric substrate;
a planar barrier layer disposed above the piezoelectric substrate; and
at least one metal conductor disposed in at least one trench in the planar barrier layer, wherein each of the at least one metal conductors further comprises a stacked conductor in a damascene configuration, including:
a diffusion barrier layer disposed above the at least one metal conductor; and
a metal layer disposed above the diffusion barrier layer,
wherein the metal conductor, the diffusion barrier layer, and the metal layer are self-aligned, and
wherein the at least one metal conductor is buried in the piezoelectric substrate and the planar barrier layer.

10. The SAW filter of claim 9, wherein the metal layer comprises Al, and wherein the at least one metal conductor comprises Cu.

11. The SAW filter of claim 9, wherein the planar barrier layer comprises $SiO_2$.

12. The SAW filter of claim 9, wherein the piezoelectric substrate comprises $LiNbO_3$.

13. The SAW filter of claim 9, wherein the diffusion barrier layer comprises one of TaN/Ta, TaSiN/Ta, WN/Ta, and WN/Ru.

* * * * *